US006680620B2

(12) United States Patent
Hedenetz et al.

(10) Patent No.: US 6,680,620 B2
(45) Date of Patent: Jan. 20, 2004

(54) METHOD FOR TIMED MEASUREMENTS OF THE VOLTAGE ACROSS A DEVICE IN THE CHARGING CIRCUIT OF A PIEZOELECTRIC ELEMENT

(75) Inventors: Andreas Hedenetz, Denkendorf (DE); Kai Barnickel, Stuttgart (DE); Josef Newald, Stuttgart (DE); Udo Schulz, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 88 days.

(21) Appl. No.: 09/825,549

(22) Filed: Apr. 2, 2001

(65) Prior Publication Data

US 2002/0008440 A1 Jan. 24, 2002

(30) Foreign Application Priority Data

Apr. 1, 2000 (EP) .......................................... 00106961

(51) Int. Cl.[7] ...................... G01R 29/22; G01R 27/26; H01L 41/08; F02M 37/08; B05B 3/04

(52) U.S. Cl. ................. 324/727; 324/658; 310/316.03; 123/498; 239/102.2

(58) Field of Search ............................... 324/727, 658, 324/659, 678; 310/317, 316.03, 309, 315, 319; 251/129.04, 129.06; 239/102.2, 690, 88; 123/490, 498

(56) References Cited

U.S. PATENT DOCUMENTS

| | | | | | |
|---|---|---|---|---|---|
| 4,767,959 | A | * | 8/1988 | Sakakibara et al. | 310/317 |
| 5,130,598 | A | | 7/1992 | Verheyen et al. | |
| 5,208,505 | A | * | 5/1993 | Mitsuyasu | 310/317 |
| 5,691,592 | A | * | 11/1997 | Gunderson et al. | 310/317 |
| 6,109,245 | A | * | 8/2000 | Egger et al. | 123/490 |
| 6,208,153 | B1 | * | 3/2001 | Flugan | 324/727 |
| 6,313,568 | B1 | * | 11/2001 | Sullivan et al. | 310/346 |
| 6,366,868 | B2 | * | 4/2002 | Freudenberg et al. | 702/115 |
| 6,435,162 | B1 | * | 8/2002 | Lingl et al. | 123/498 |
| 6,459,244 | B1 | * | 10/2002 | Hoffmann et al. | 320/166 |
| 6,472,796 | B1 | * | 10/2002 | Hoffmann et al. | 310/316.03 |
| 6,498,418 | B2 | * | 12/2002 | Rueger | 310/316.03 |

FOREIGN PATENT DOCUMENTS

| | | |
|---|---|---|
| DE | 197 29 844 | 1/1999 |
| DE | 197 42 073 | 3/1999 |
| EP | 371 469 | 6/1990 |
| EP | 0 379 182 | 7/1990 |
| EP | 0 464 443 | 1/1992 |

* cited by examiner

*Primary Examiner*—Anjan K. Deb
(74) *Attorney, Agent, or Firm*—Kenyon & Kenyon

(57) ABSTRACT

A method for timed measurement of a voltage across a device in a charging circuit of a piezoelectric element. The voltage across the device is sensed and read at a predefined time in synchronization with an injection event of the at least one piezoelectric actuator. The device may be the piezoelectric element or a buffer capacitor.

13 Claims, 7 Drawing Sheets

METHOD FOR TIMED MEASUREMENTS OF THE VOLTAGE ACROSS A DEVICE IN THE CHARGING CIRCUIT OF A PIEZOELECTRIC ELEMENT

Method and Apparatus for Timed Measurement of the Voltage Across a Device in the Charging Circuit of a Piezoelectric Element The present invention concerns a method for timed measurement of the voltage across a device in the charging circuit of a piezoelectric element.

The present piezoelectric elements being considered in more detail are, in particular but not exclusively, piezoelectric elements used as actuators. Piezoelectric elements can be used for such purposes because, as is known, they possess the property of contracting or expanding as a function of a voltage applied thereto. The practical implementation of actuators using piezoelectric elements is advantageous in particular if the actuator in question must perform rapid and/or frequent movements.

The use of piezoelectric elements as actuators proves to be advantageous, inter alia, in fuel injection nozzles for internal combustion engines. See both references EP 0 371 469 B1 and EP 0 379 182 B1 regarding the usability of piezoelectric elements as injection valve actuators. Such piezoelectric elements are charged to a specific, generally working point-dependent, voltage. The piezoelectric elements experience a longitudinal expansion that is used to control the opening and closing of the Injection valves. By appropriately charging and discharging the piezoelectric elements, a desired injection operation or injection profile may be obtained.

FIG. 7 is a schematic representation of a fuel injection system using a piezoelectric element 2010 as an actuator. Referring to FIG. 7, the piezoelectric element 2010 is electrically energized to expand and contract in response to a given activation voltage. The piezoelectric element 2010 is coupled to a piston 2015. In the expanded state, the piezoelectric element 2010 causes the piston 2015 to protrude into a hydraulic adapter 2020 which contains a hydraulic fluid, for example fuel. As a result of the piezoelectric element's expansion, a double acting control valve 2025 is hydraulically pushed away from hydraulic adapter 2020 and the valve plug 2035 is extended away from a first closed position 2040. The combination of double acting control valve 2025 and hollow bore 2050 is often referred to as double acting, double seat valve for the reason that when piezoelectric element 2010 is in an unexcited state, the double acting control valve 2025 rests in its first closed position 2040. On the other hand, when the piezoelectric element 2010 is fully extended, it rests in its second closed position 2030. The later position of valve plug 2035 is schematically represented with ghost lines in FIG. 7.

The fuel injection system comprises an injection needle 2070 allowing for injection of fuel from a pressurized fuel supply line 2060 into the cylinder (not shown). When the piezoelectric element 2010 Is unexcited or when it is fully extended, the double acting control valve 2025 rests respectively in its first closed position 2040 or in its second closed position 2030. In either case, the hydraulic rail pressure maintains injection needle 2070 at a closed position. Thus, the fuel mixture does not enter into the cylinder (not shown). Conversely, when the piezoelectric element 2010 is excited such that double acting control valve 2025 is in the so-called mid-position with respect to the hollow bore 2050, then there is a pressure drop in the pressurized fuel supply line 2060. This pressure drop results in a pressure differential in the pressurized fuel supply line 2060 between the top and the bottom of the injection needle 2070 so that the injection needle 2070 is lifted allowing for fuel injection into the cylinder (not shown).

A more detailed description of a corresponding system can be found at German patent application Nos. DE 197 42 073 A1 and DE 1976 29 844 A1, which are hereby incorporated by reference herein in their entirety. These patent applications disclose piezoelectric elements with double acting, double seat valves for controlling injection needles in a fuel injection system.

In order to achieve precise fuel injection volumes, high accuracy in the degree of longitudinal expansion of the piezoelectric element is important, and, hence, a high accuracy in the charge voltage level is important. Aging phenomena and temperature may have marked effects on the longitudinal expansion, or stroke, and capacitance of a piezoelectric element. A desired stroke may require different charge voltages, depending on the age and/or temperature of the actuator element. In order to ensure a desired stroke of the actuator and especially of an associated valve, the charge voltage must be accordingly regulated. It is therefore important to be able to measure the voltage across a piezoelectric element in a timely and accurate fashion. It may also be important to be able to measure the voltage across a buffer capacitor in the charging circuit of a piezoelectric element for diagnostic purposes.

An object of the invention is to measure the voltage values of devices in the charging circuit of a piezoelectric element in a timely and accurate fashion using a simple measurement and timing concept. The capacitance and energy loss or the power dissipation factor of the actuator may be determined. It is thereby possible to compensate for actuator aging phenomena and accordingly regulate the actuator reference voltage. The buffer capacitor and associated circuitry may also be diagnosed.

The present invention provides a method in accordance with the preamble of claim 1, i.e., a method for timed measurement of the voltage across a device in the charging circuit of at least one piezoelectric element. The voltage across the device is sensed, and the sensed voltage is read at a predefined time in synchronization with an injection operation of the at least one piezoelectric element.

The present invention also provides an apparatus for timed measurement of the voltage across a device in the charging circuit of at least one piezoelectric element. A voltage measuring device is provided. The voltage measuring device senses a voltage across the device, and the voltage measuring device reads the sensed voltage at least one predefined time in synchronization with an injection operation of the at least one piezoelectric actuator.

The device whose voltage is measured may be the at least one piezoelectric element itself of the buffer capacitor of the charging circuit.

The present invention also provides an apparatus for timed measuring of a voltage across a first bank of piezoelectric elements arranged in parallel and a voltage across a second bank of piezoelectric elements arranged in parallel. A voltage measuring device is provided. The voltage measuring device senses the voltages, and the voltage measuring device reads the sensed voltages at a predefined time in synchronization with an injection operation of at least one of the piezoelectric elements.

The present invention employs a voltage measurement triggered in actuator-specific fashion in synchronization with the injection operation. Control or correction of the actuator voltage, as well as diagnosis of the buffer capacitor, is thereby enabled. The desired actuator stroke can be achieved with greater accuracy than before, thus yielding more accurate injection.

The invention will be explained below in more detail with reference to exemplary embodiments, referring to the figures in which:

FIG. 1*a* shows a graph depicting an injection cycle for a piezoelectric element used as an actuator;

FIG. 1*b* shows a graph representing injection control valve position corresponding to the injection cycle of FIG. 1*a;*

FIG. 1*c* shows a graph depicting strobe pulses corresponding to the injection cycle of FIG. 1*a;*

FIG. 1*d* shows a graph depicting voltage measurement trigger pulses corresponding to the injection cycle of FIG. 1*a;*

FIG. 2 shows a schematic diagram of an exemplary apparatus for timed measurement of the voltage across at least one piezoelectric element of a fuel injection system;

FIG. 3*a* shows a schematic circuit diagram for explaining a first charging phase (charging switch 220 closed) in the apparatus of FIG. 2;

FIG. 3*b* shows a schematic circuit diagram for explaining a second charging phase (charging switch 220 open) in the apparatus of FIG. 2;

FIG. 3*c* shows a schematic circuit diagram for explaining a first discharging phase (discharging switch 230 closed) in the apparatus of FIG. 2;

FIG. 3*d* shows a schematic circuit diagram for explaining a second discharging phase (discharging switch 230 open) in the apparatus of FIG. 2;

Figures 6A, 6B, 6C, 6D:
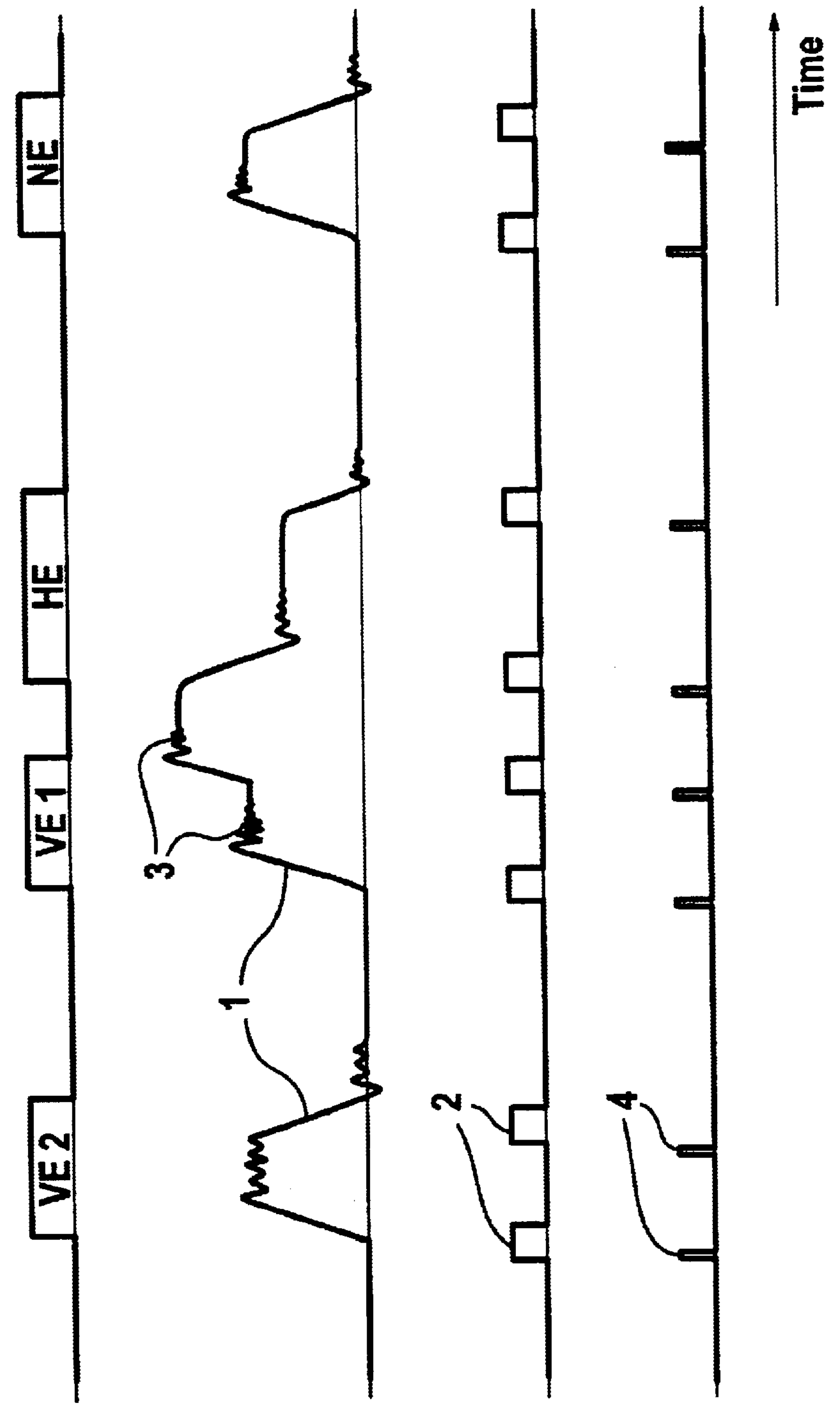
Figure 7:
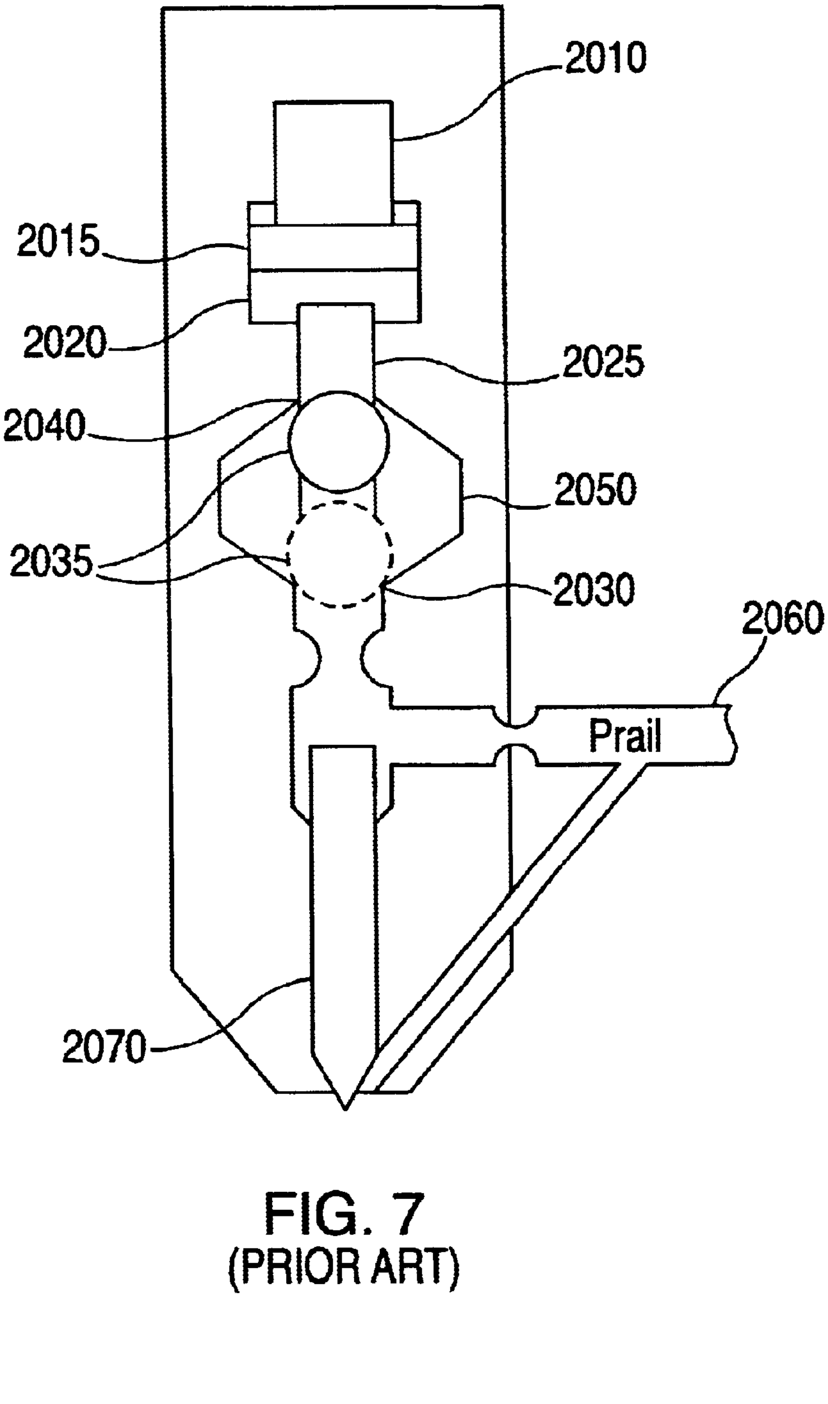
FIG. 7 (PRIOR ART)

FIGS. 6*a–d* show graphs similar to those of FIGS. 1*a–d*, for timing voltage measurement trigger pulses so as to avoid piezoelectric actuator voltage oscillations following a charging/discharging action of the actuator; and FIG. 7 shows a schematic representation of a fuel injection system.

Reference is first had to FIGS. 1*a–d*, the graphs in which all share a common time axis along the horizontal from left to right.

Figures 1A, 1B, 1C, 1D:
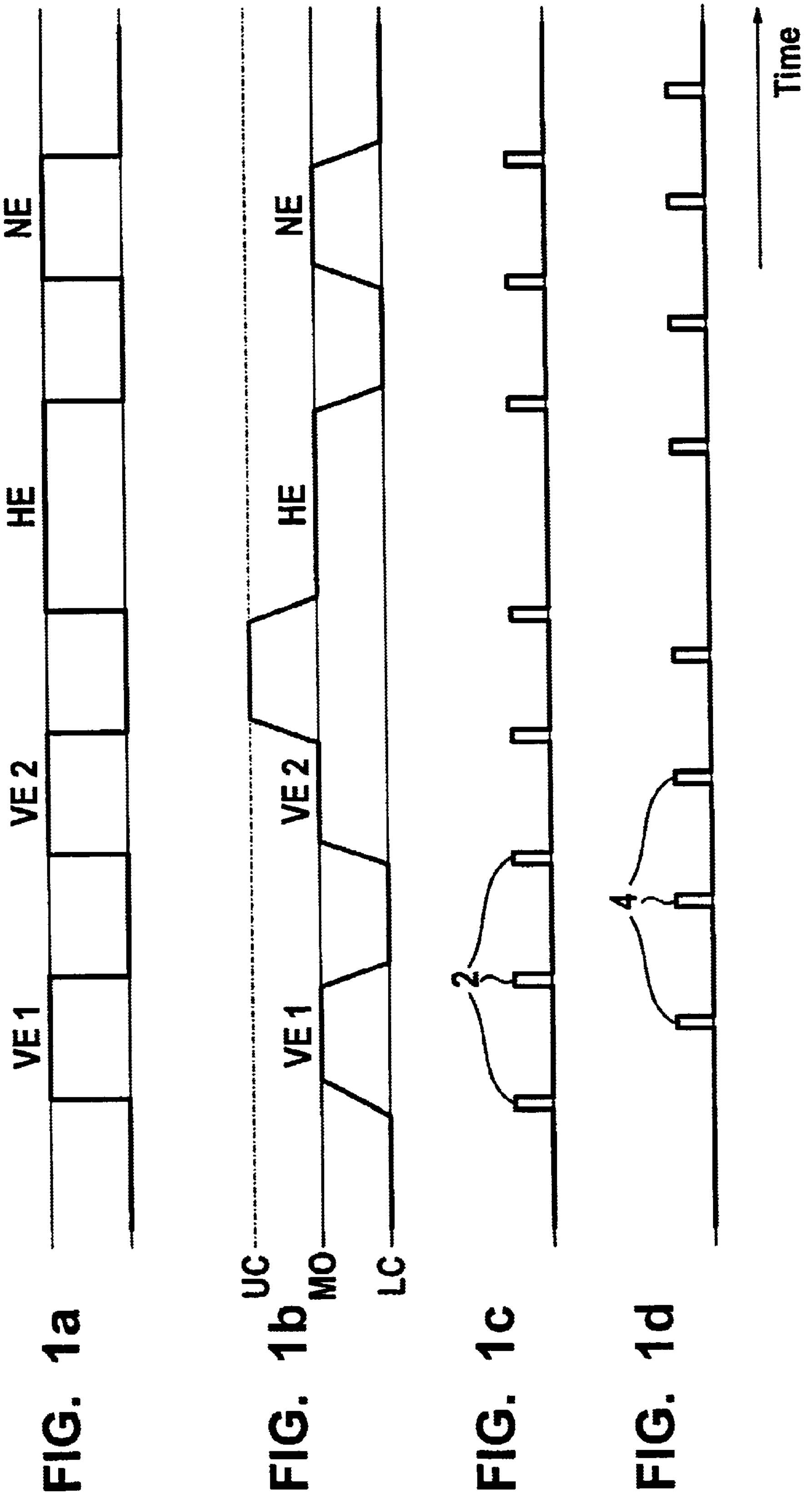

FIG. 1*a* shows a graph depicting an exemplary injection profile for an injection cycle of a piezoelectric actuator. Time is along the horizontal axis from left to right. A positive displacement on the vertical axis represents the existence of an injection event. VE1, VE2, HE and NE represent first pre-injection, second pre-injection, main injection and post-injection, respectively, events.

FIG. 1*b* shows a graphical representation of injection control valve position corresponding to the injection profile of FIG. 1*a* for a double seat control valve displaced by the piezoelectric actuator. The vertical axis represents control valve position, with LC indicating the lower seat closed position, MO representing middle open position, and UC representing the upper seat closed position. Injection events VE1, VE2, HE and NE, correspond to those shown in FIG. 1*a*. As is evident, injection events occur when the control valve is in the middle open position MO, while no injection occurs when the control valve is in either the lower seat closed position LC or the upper seat closed position UC.

FIG. 1*c* shows a graph depicting strobe pulses 2 corresponding to the injection profile of FIG. 1*a*. The strobe pulses 2 serve as trigger signals for starting a charging or discharging action of the piezoelectric actuator, and correspondingly starting or ending an injection event. Accordingly, as may be seen by comparing FIGS. 1*a* and 1*c*, strobe pulses 2 correspond to the start and end of injection events VE1, VE2, HE and NE. As discussed above, selective charging and discharging of the piezoelectric actuator cause the actuator to longitudinally expand, thereby opening and closing the injection valve to achieve a desired injection profile. Strobe pulses 2 are produced by a piezoelectric actuator control system, an exemplary embodiment of which will be discussed in further detail below.

FIG. 1*d* shows a graph depicting voltage measurement trigger pulses 4 corresponding to the injection profile of FIG. 1*a*. Voltage measurement trigger pulses 4 serve to cause the voltage across the piezoelectric element to be read and stored. Voltage measurement trigger pulses 4 preferably occur a constant time offset At before or after an intentional charging or discharging event of the piezoelectric element. This corresponds to a time offset At before the beginning or after the trailing edge of a strobe pulse 2. FIG. 1*d* depicts an embodiment in which voltage measurement trigger pulses 4 are set to occur a time offset At after the trailing edge of a strobe pulse. In other embodiments of the present invention, the time offset At may be of variable magnitude and/or may occur before the beginning of some strobe pulses and after the end of other strobe pulses. Voltage measurement trigger pulses 4 are produced by the piezoelectric actuator control system, an exemplary embodiment of which will be discussed in further detail below.

Figure 2:
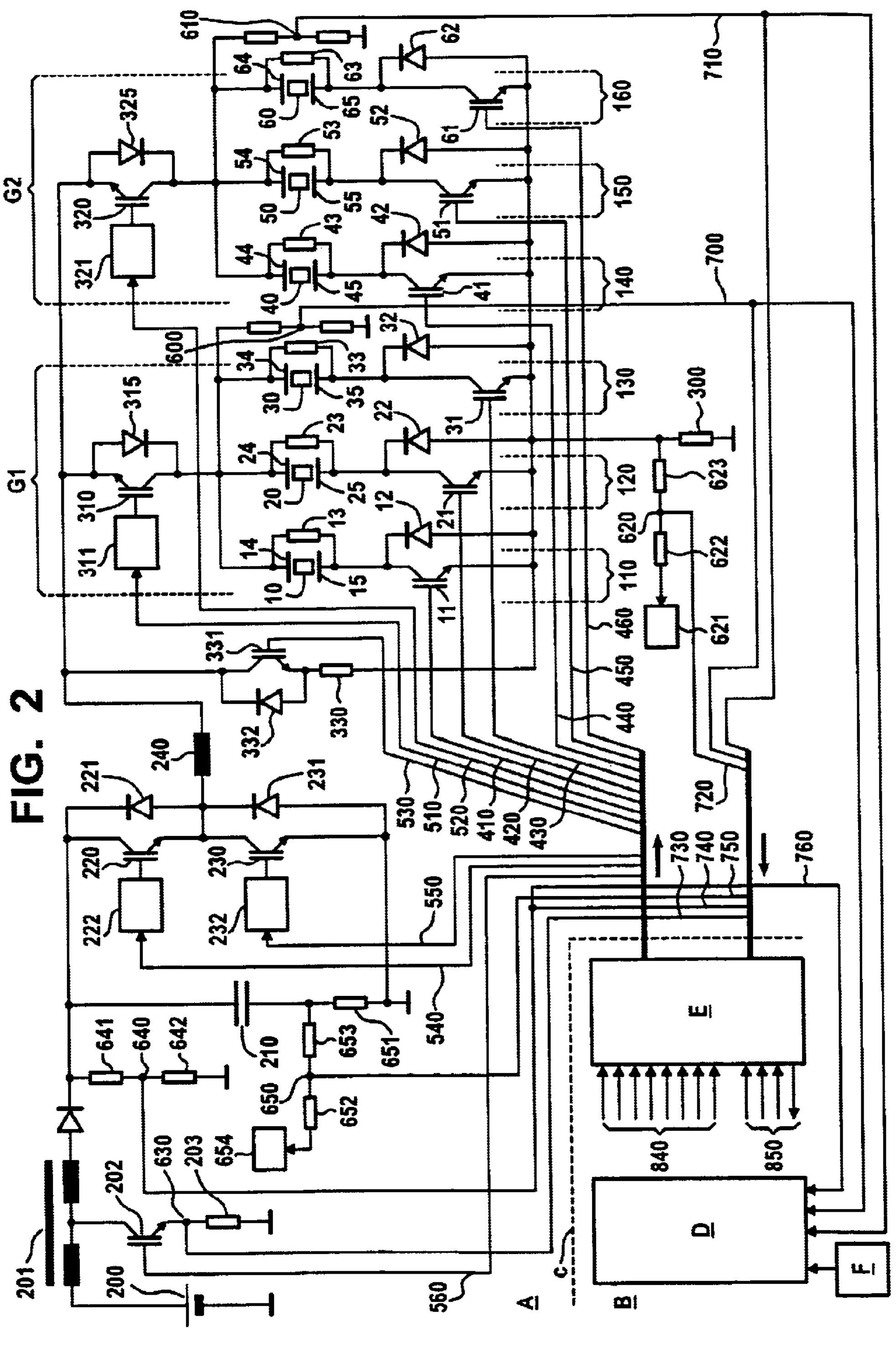

Reference is now had to FIG. 2, which shows a schematic diagram of an exemplary apparatus for timed measurement of the voltage across at least one piezoelectric element of a fuel injection system. In FIG. 2 there is a detailed area A and a non-detailed area B, the separation of which is indicated by a dashed line c. The detailed area A comprises a circuit for charging and discharging piezoelectric elements 10, 20, 30, 40, 50 and 60. In the example being considered, these piezoelectric elements 10, 20, 30, 40, 50, 60 are actuators in fuel injection nozzles (in particular in so-called common rail injectors) of an internal combustion engine. Piezoelectric elements can be used for such purposes because, as is known, they possess the property of contracting or expanding as a function of a voltage applied thereto or occurring therein. The non-detailed area B comprises a control unit D and an activation IC E by both of which the elements within the detailed area A are controlled, as well as measuring components F for measuring occurring rail pressures.

As mentioned above, the circuit within the detailed area A comprises six piezoelectric elements 10, 20, 30, 40, 50, 60. The reason to take six piezoelectric elements 10, 20, 30, 40, 50, 60 in the embodiment described is to independently control six cylinders within a combustion engine; hence, any other number of piezoelectric elements might match any other purpose.

The piezoelectric elements 10, 20, 30, 40, 50, 60 are distributed into a first group, or bank, G1 and a second group, or bank, G2, each comprising three piezoelectric elements (i.e., piezoelectric elements 10, 20 and 30 in the first group G1 and piezoelectric elements 40, 50 and 60 in the second group G2). Groups G1 and G2 are constituents of circuit parts connected in parallel with one another. Group selector switches 310, 320 can be used to establish which of the groups G1, G2 of piezoelectric elements 10, 20 and 30 and 40, 50 and 60, respectively, will be discharged in each case by a common charging and discharging apparatus (however, the group selector switches 310, 320 are meaningless for charging procedures, as is explained in further detail below).

The group selector switches 310, 320 are arranged between a coil 240 and the respective groups G1 and G2 (the coil-side terminals thereof) and are implemented as transistors. Side drivers 311, 321 are implemented which transform control signals received from the activation IC E into voltages which are eligible for closing and opening the switches as required.

Diodes 315 and 325 (referred to as group selector diodes), respectively, are provided in parallel with the group selector switches 310, 320. If the group selector switches 310, 320 are implemented as MOSFETs or IGBTs, for example, these group selector diodes 315, 325 can be constituted by the parasitic diodes themselves. The diodes 315, 325 bypass the group selector switches 310, 320 during charging procedures. Hence, the functionality of the group selector switches 310, 320 is reduced to select a group G1, G2 of piezoelectric elements 10, 20 and 30, resp. 40, 50 and 60 for a discharging procedure only.

Within each group G1 resp. G2 the piezoelectric elements 10, 20 and 30, resp. 40, 50 and 60 are arranged as constituents of piezo branches 110, 120 and 130 (group G1) and 140, 150 and 160 (group G2) that are connected in parallel. Each piezo branch comprises a series circuit made up of a first parallel circuit comprising a piezoelectric element 10, 20, 30, 40, 50 resp. 60 and a resistor 13, 23, 33, 43, 53 resp. 63 (referred to as branch resistors) and a second parallel circuit made up of a selector switch implemented as a transistor 11, 21, 31, 41, 51 resp. 61 (referred to as branch selector switches) and a diode 12, 22, 32, 42, 52 resp. 62 (referred to as branch diodes).

The branch resistors 13, 23, 33, 43, 53 resp. 63 cause each corresponding piezoelectric element 10, 20, 30, 40, 50 resp. 60 during and after a charging procedure to continuously discharge themselves, since they connect both terminals of each capacitive piezoelectric element 10, 20, 30, 40, 50, resp. 60 one to another. However, the branch resistors 13, 23, 33, 43, 53 resp. 63 are sufficiently large to make this procedure slow compared to the controlled charging and discharging procedures as described below. Hence, it is still a reasonable assumption to consider the charge of any piezoelectric element 10, 20, 30, 40, 50 or 60 as unchanging within a relevant time after a charging procedure (the reason to nevertheless implement the branch resistors 13, 23, 33, 43, 53 and 63 is to avoid remaining charges on the piezoelectric elements 10, 20, 30, 40, 50 and 60 in case of a breakdown of the system or other exceptional situations). Hence, the branch resistors 13, 23, 33, 43, 53 and 63 may be neglected in the following description.

The branch selector switch/branch diode pairs in the individual piezo branches 110, 120, 130, 140, 150 resp. 160, i.e., selector switch 11 and diode 12 in piezo branch 110, selector switch 21 and diode 22 in piezo branch 120, and so on, can be implemented using electronic switches (i.e., transistors) with parasitic diodes, for example MOSFETs or IGBTs (as stated above for the group selector switch/diode pairs 310 and 315 resp. 320 and 325). The branch selector switches 11, 21, 31, 41, 51 resp. 61 can be used to establish which of the piezoelectric elements 10, 20, 30, 40, 50 or 60 will be charged in each case by a common charging and discharging apparatus: in each case, the piezoelectric elements 10, 20, 30, 40, 50 or 60 that are charged are all those whose branch selector switches 11, 21, 31, 41, 51 or 61 are closed during the charging procedure which is described below.

The branch diodes 12, 22, 32, 42, 52 and 62 serve for bypassing the branch selector switches 11, 21, 31, 41, 51 resp. 61 during discharging procedures. Hence, in the example considered for charging procedures any individual piezoelectric element can be selected, whereas for discharging procedures either the first group G1 or the second group G2 of piezoelectric elements 10, 20 and 30 resp. 40, 50 and 60 or both have to be selected.

Returning to the piezoelectric elements 10, 20, 30, 40, 50 and 60 themselves, the branch selector piezo terminals 15, 25, 35, 45, 55 resp. 65 may be connected to ground either through the branch selector switches 11, 21, 31, 41, 51 resp. 61 or through the corresponding diodes 12, 22, 32, 42, 52 resp. 62 and in both cases additionally through resistor 300.

The purpose of resistor 300 is to measure the currents that flow during charging and discharging of the piezoelectric elements 10, 20, 30, 40, 50 and 60 between the branch selector piezo terminals 15, 25, 35, 45, 55 resp. 65 and the ground. A knowledge of these currents allows a controlled charging and discharging of the piezoelectric elements 10, 20, 30, 40, 50 and 60. In particular, by closing and opening charging switch 220 and discharging switch 230 in a manner dependent on the magnitude of the currents, it is possible to set the charging current and discharging current to predefined average values and/or to keep them from exceeding or falling below predefined maximum and/or minimum values as is explained in further detail below.

In the example considered, the measurement itself further requires a voltage source 621 which supplies a voltage of, for example, 5 V DC and a voltage divider implemented as two resistors 622 and 623. This is in order to prevent the activation IC E (by which the measurements are performed) from negative voltages which might otherwise occur on measuring point 620 and which cannot be handled by means of activation IC E: such negative voltages are changed into positive voltages by means of addition with a positive voltage setup which is supplied by said voltage source 621 and voltage divider resistors 622 and 623.

The other terminal of each piezoelectric element 10, 20, 30, 40, 50 and 60, i.e. the group selector piezo terminal 14, 24, 34, 44, 54 resp. 64, may be connected to the plus pole of a voltage source via the group selector switch 310 resp. 320 or via the group selector diode 315 resp. 325 as well as via a coil 240 and a parallel circuit made up of a charging switch 220 and a charging diode 221, and alternatively or additionally connected to ground via the group selector switch 310 resp. 320 or via diode 315 resp. 325 as well as via the coil 240 and a parallel circuit made up of a discharging switch 230 or a discharging diode 231. Charging switch 220 and discharging switch 230 are implemented as transistors which are controlled via side drivers 222 resp. 232.

The voltage source comprises an element having capacitive properties which, in the example being considered, is the (buffer) capacitor 210. Capacitor 210 is charged by a battery 200 (for example a motor vehicle battery) and a DC voltage converter 201 downstream therefrom. DC voltage converter 201 converts the battery voltage (for example, 12 V) into substantially any other DC voltage (for example 250 V), and charges capacitor 210 to that voltage. DC voltage converter 201 is controlled by means of transistor switch 202 and resistor 203 which is utilized for current measurements taken from a measuring point 630.

For cross check purposes, a further current measurement at a measuring point 650 is allowed by activation IC E as well as by resistors 651, 652 and 653 and a, for example, 5 V DC voltage source 654; moreover, a voltage measurement at a measuring point 640 is allowed by activation IC E as well as by voltage dividing resistors 641 and 642.

Finally, a resistor 330 (referred to as total discharging resistor), a stop switch implemented as a transistor 331

(referred to as stop switch), and a diode 332 (referred to as total discharging diode) serve to discharge the piezoelectric elements 10, 20, 30, 40, 50 and 60 (if they happen to be not discharged by the "normal" discharging operation as described further below). Stop switch 331 is preferably closed after "normal" discharging procedures (cycled discharging via discharge switch 230). It thereby connects piezoelectric elements 10, 20, 30, 40, 50 and 60 to ground through resistors 330 and 300, and thus removes any residual charges that might remain in piezoelectric elements 10, 20, 30, 40, 50 and 60. The total discharging diode 332 prevents negative voltages from occurring at the piezoelectric elements 10, 20, 30, 40, 50 and 60, which might in some circumstances be damaged thereby.

Charging and discharging of all the piezoelectric elements 10, 20, 30, 40, 50 and 60 or any particular one is accomplished by way of a single charging and discharging apparatus (common to all the groups and their piezoelectric elements). In the example being considered, the common charging and discharging apparatus comprises battery 200, DC voltage converter 201, capacitor 210, charging switch 220 and discharging switch 230, charging diode 221 and discharging diode 231 and coil 240.

The charging and discharging of each piezoelectric element works the same way and is explained in the following while referring to the first piezoelectric element 10 only.

Figure 3A:
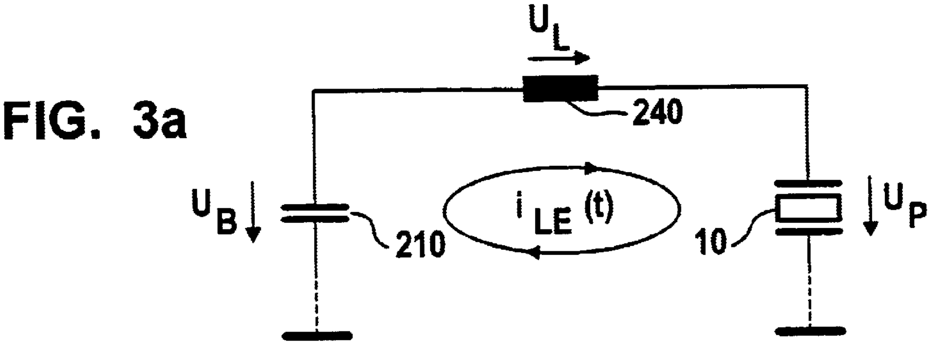
Figure 3B:
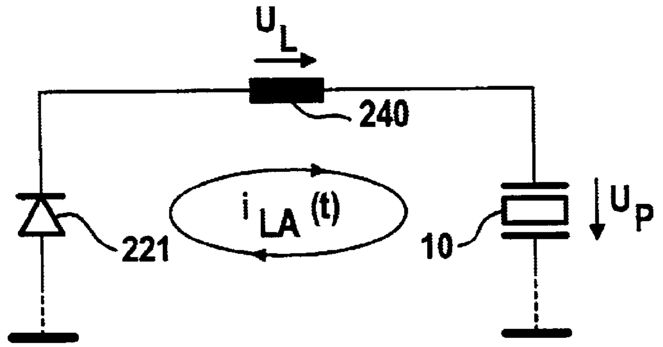

The conditions occurring during the charging and discharging procedures are explained with reference to FIGS. 3*a* through 3*d*, of which FIGS. 3*a* and 3*b* illustrate the charging of piezoelectric element 10, and FIGS. 3*c* and 3*d* the discharging of piezoelectric element 10.

The selection of one or more particular piezoelectric elements 10, 20, 30, 40, 50 or 60 to be charged or discharged, the charging procedure as described in the following as well as the discharging procedure are driven by activation IC E and control unit D by means of opening or closing one or more of the above introduced switches 11, 21, 31, 41, 51, 61; 310, 320; 220, 230 and 331. The interactions between the elements within the detailed area A on the on hand and activation IC E and control unit D on the other hand are described in detail further below.

Concerning the charging procedure, firstly any particular piezoelectric element 10, 20, 30, 40, 50 or 60 which is to be charged has to be selected. In order to exclusively charge the first piezoelectric element 10, the branch selector switch 11 of the first branch 110 is closed, whereas all other branch selector switches 21, 31, 41, 51 and 61 remain opened. In order to exclusively charge any other piezoelectric element 20, 30, 40, 50, 60 or in order to charge several ones at the same time they would be selected by closing the corresponding branch selector switches 21, 31, 41, 51 and/or 61.

Then, the charging procedure itself may take place:

Generally, within the example considered, the charging procedure requires a positive potential difference between capacitor 210 and the group selector piezo terminal 14 of the first piezoelectric element 10. However, as long as charging switch 220 and discharging switch 230 are open no charging or discharging of piezoelectric element 10 occurs. In this state, the circuit shown in FIG. 2 is in a steady-state condition, i.e., piezoelectric element 10 retains its charge state in substantially unchanged fashion, and no currents flow.

In order to charge the first piezoelectric element 10, charging switch 220 is closed. Theoretically, the first piezoelectric element 10 could become charged just by doing so. However, this would produce large currents which might damage the elements involved. Therefore, the occurring currents are measured at measuring point 620 and switch 220 is opened again as soon as the detected currents exceed a certain limit. Hence, in order to achieve any desired charge on the first piezoelectric element 10, charging switch 220 is repeatedly closed and opened whereas discharging switch 230 remains open.

In more detail, when charging switch 220 is closed, the conditions shown in FIG. 3*a* occur, i.e., a closed circuit comprising a series circuit made up of piezoelectric element 10, capacitor 210, and coil 240 is formed, in which a current $_{ILe}$(t) flows as indicated by arrows in FIG. 3*a*. As a result of this current flow both positive charges are brought to the group selector piezo terminal 14 of the first piezoelectric element 10 and energy is stored in coil 240.

When charging switch 220 opens shortly (for example, a few μs) after it has closed, the conditions shown in FIG. 3*b* occur: a closed circuit comprising a series circuit made up of piezoelectric element 10, charging diode 221, and coil 240 is formed, in which a current $_{ILA}$(t) flows as indicated by arrows in FIG. 3*b*. The result of this current flow is that energy stored in coil 240 flows into piezoelectric element 10. Corresponding to the energy delivery to the piezoelectric element 10, the voltage occurring in the latter, and its external dimensions, increase. Once energy transport has taken place from coil 240 to piezoelectric element 10, the steady-state condition of the circuit, as shown in FIG. 2 and already described, is once again attained.

At that time, or earlier, or later (depending on the desired time profile of the charging operation), charging switch 220 is once again closed and opened again, so that the processes described above are repeated. As a result of the re-closing and re-opening of charging switch 220, the energy stored in piezoelectric element 10 increases (the energy already stored in the piezoelectric element 10 and the newly delivered energy are added together), and the voltage occurring at the piezoelectric element 10, and its external dimensions, accordingly increase.

If the aforementioned closing and opening of charging switch 220 are repeated numerous times, the voltage occurring at the piezoelectric element 10, and the expansion of the piezoelectric element 10, rise in steps.

Once charging switch 220 has closed and opened a predefined number of times, and/or once piezoelectric element 10 has reached the desired charge state, charging of the piezoelectric element is terminated by leaving charging switch 220 open.

Concerning the discharging procedure, in the example considered, the piezoelectric elements 10, 20, 30, 40, 50 and 60 are discharged in groups (G1 and/or G2) as follows:

Firstly, the group selector switch(es) 310 and/or 320 of the group or groups G1 and/or G2 the piezoelectric elements of which are to be discharged are closed (the branch selector switches 11, 21, 31, 41, 51, 61 do not affect the selection of piezoelectric elements 10, 20, 30, 40, 50, 60 for the discharging procedure, since in this case they are bypassed by the branch diodes 12, 22, 32, 42, 52 and 62). Hence, in order to discharge piezoelectric element 10 as a part of the first group G1, the first group selector switch 310 is closed.

Figure 3C:
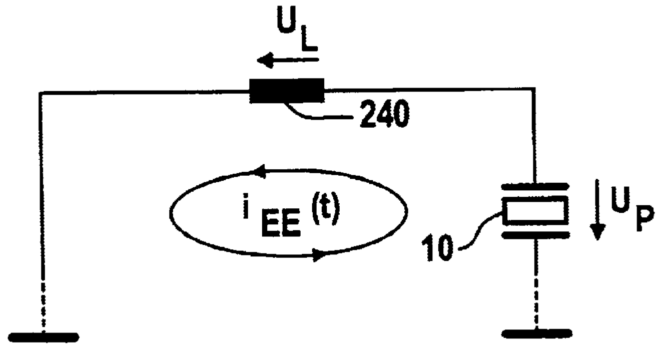

When discharging switch 230 is closed, the conditions shown in FIG. 3*c* occur: a closed circuit comprising a series circuit made up of piezoelectric element 10 and coil 240 is formed, in which a current $_{see}$(t) flows as indicated by arrows in FIG. 3*c*. The result of this current flow is that the energy (a portion thereof) stored in the piezoelectric element is transported into coil 240. Corresponding to the energy transfer from piezoelectric element 10 to coil 240, the voltage occurring at the piezoelectric element 10, and its external dimensions, decrease.

Figure 3D:
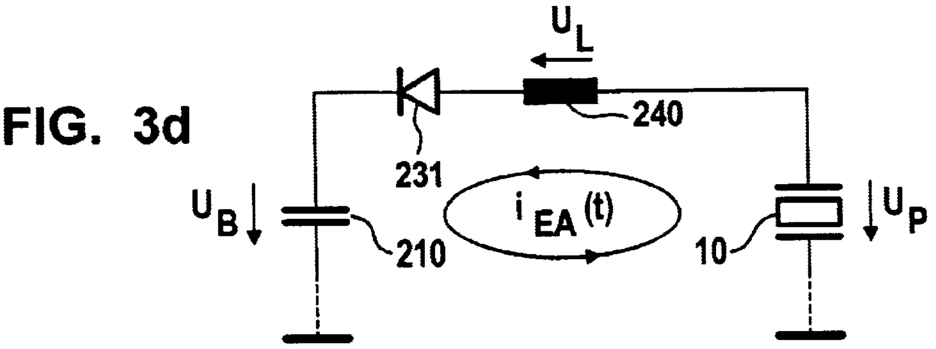

When discharging switch 230 opens shortly (for example, a few μs) after it has closed, the conditions shown in FIG. 3*d* occur: a closed circuit comprising a series circuit made up of piezoelectric element 10, capacitor 210, discharging diode 231, and coil 240 is formed, in which a current $_{idea}$(t) flows as indicated by arrows in FIG. 3*d*. The result of this current flow is that energy stored in coil 240 is fed back into capacitor 210. Once energy transport has taken place from coil 240 to capacitor 210, the steady-state condition of the circuit, as shown in FIG. 2 and already described, is once again attained.

At that time, or earlier, or later (depending on the desired time profile of the discharging operation), discharging switch 230 is once again closed and opened again, so that the processes described above are repeated. As a result of the re-closing and re-opening of discharging switch 230, the energy stored in piezoelectric element 10 decreases further, and the voltage occurring at the piezoelectric element, and its external dimensions, also accordingly decrease.

If the aforementioned closing and opening of discharging switch 230 are repeated numerous times, the voltage occurring at the piezoelectric element 10, and the expansion of the piezoelectric element 10, decrease in steps.

Once discharging switch 230 has closed and opened a predefined number of times, and/or once the piezoelectric element has reached the desired discharge state, discharging of the piezoelectric element 10 is terminated by leaving discharging switch 230 open.

The interaction between activation IC E and control unit D on the one hand and the elements within the detailed area A on the other hand is performed by control signals sent from activation IC E to elements within the detailed area A via branch selector control lines 410, 420, 430, 440, 450, 460, group selector control lines 510, 520, stop switch control line 530, charging switch control line 540 and discharging switch control line 550 and control line 560. On the other hand, there are sensor signals obtained on measuring points 600, 610, 620, 630, 640, 650 within the detailed area A which are transmitted to activation IC E via sensor lines 700, 710, 720, 730, 740, 750, as well as to control unit D via sensor lines 700 and 710.

The control lines are used to apply or not to apply voltages to the transistor bases in order to select piezoelectric elements 10, 20, 30, 40, 50 or 60, to perform charging or discharging procedures of single or several piezoelectric elements 10, 20, 30, 40, 50, 60 by means of opening and closing the corresponding switches as described above. The sensor signals are particularly used to determine the resulting voltage of the piezoelectric elements 10, 20, 30 and 40, 50, 60 from measuring points 600 and 610, respectively, and the charging and discharging currents from measuring point 620. Control unit D and activation IC E are used to combine both kinds of signals in order to perform an interaction of both as will be described in detail now while referring to FIGS. 2 and 4.

As is indicated in FIG. 2, control unit D and activation IC E are connected to each other by means of a parallel bus 840 and additionally by means of a serial bus 850. The parallel bus 840 is particularly used for fast transmission of control signals from control unit D to the activation IC E, whereas the serial bus 850 is used for slower data transfer.

Figure 4:
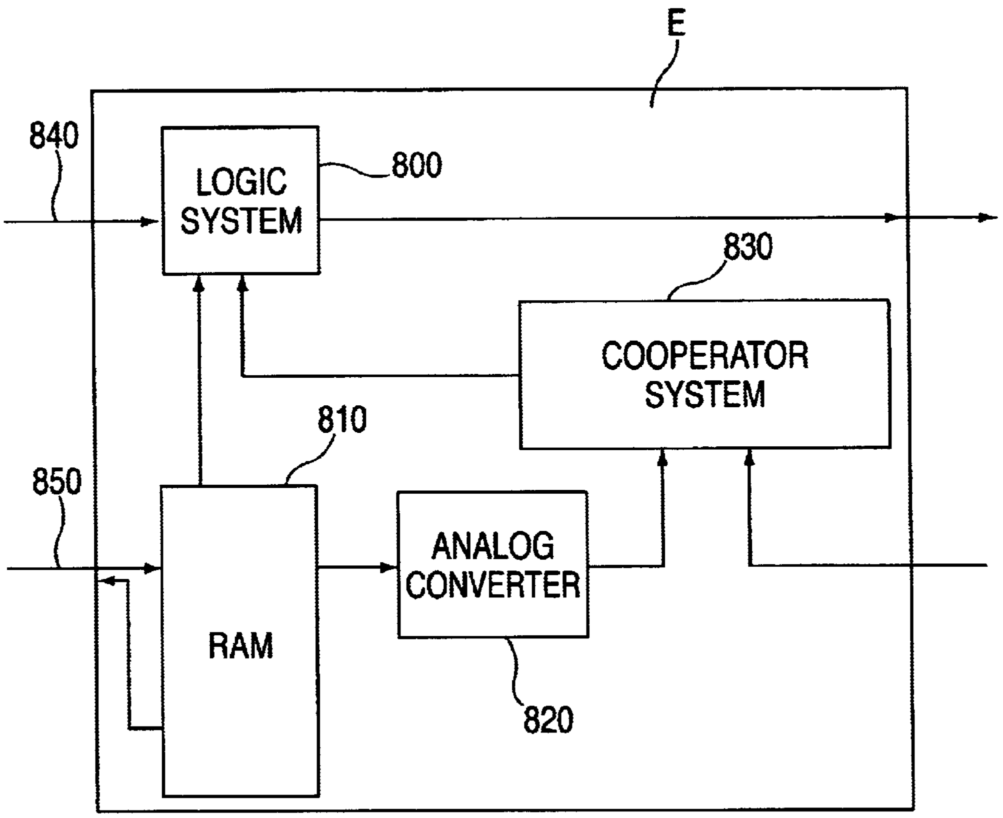
FIG. 4 shows a block diagram of the activation IC E of FIG. 2.

In FIG. 4 some components of general significance are indicated: a logic circuit 800, RAM memory 810, digital to analog converter system 820 and cooperator system 830. Furthermore, it is indicated that the fast parallel bus 840 (used for control signals) is connected to the logic circuit 800 of the activation IC E, whereas the slower serial bus 850 is connected to the RAM memory 810. The logic circuit 800 is connected to the RAM memory 810, to the cooperator system 830 and to the signal lines 410, 420, 430, 440, 450 and 460; 510 and 520; 530; 540, 550 and 560. The RAM memory 810 is connected to the logic circuit 800 as well as to the digital to analog converter system 820. The digital to analog converter system 820 is further connected to the cooperator system 830. The cooperator system 830 is further connected to the sensor lines 700 and 710; 720; 730, 740 and 750 and—as already mentioned—to the logic circuit 800.

The above listed components may be used in a charging procedure for example as follows:

By means of the control unit D, described in more detail below with reference to FIG. 5, a particular piezoelectric element 10, 20, 30, 40, 50 or 60 is determined which is to be charged to a certain target voltage. Then, the value of the target voltage (expressed by a digital number) is be transmitted to the RAM memory 810 via the slower serial bus 850. Later or simultaneously, a code signal corresponding to the particular piezoelectric element 10, 20, 30, 40, 50 or 60 which is to be selected and including information about the address of the transmitted voltage within the RAM memory 810 is transmitted to the logic circuit 800 via the parallel bus 840. Later on, a strobe signal 2, as discussed above with reference to FIG. 1*c*, is sent to the logic circuit 800 via the parallel bus 840 which gives the start signal for the charging procedure.

The start signal firstly causes the logic circuit 800 to pick up the digital value of the target voltage from the RAM memory 810 and to put it on the digital to analog converter system 820 whereby at one analog exit of the converters 820 the desired voltage occurs. Moreover, said analog exit (not shown) is connected to the cooperator system 830. In addition hereto, the logic circuit 800 selects either measuring point 600 (for any of the piezoelectric elements 10, 20 or 30 of the first group G1) or measuring point 610 (for any of the piezoelectric elements 40, 50 or 60 of the second group G2) to the cooperator system 830. Resulting thereof, the target voltage and the present voltage at the selected piezoelectric element 10, 20, 30, 40, 50 or 60 are compared by the cooperator system 830. The results of the comparison, i.e., the differences between the target voltage and the present voltage, are transmitted to the logic circuit 800. Thereby, the logic circuit 800 can stop the procedure as soon as the target voltage and the present voltage are equal to one another.

Secondly, the logic circuit 800 applies a control signal to the branch selector switch 11, 21, 31, 41, 51 or 61 which corresponds to any selected piezoelectric element 10, 20, 30, 40, 50 or 60 so that the switch becomes closed (all branch selector switches 11, 21, 31, 41, 51 and 61 are considered to be in an open state before the onset of the charging procedure within the example described). Then, the logic circuit 800 applies a control signal to the charging switch 220 so that the switch becomes closed. Furthermore, the logic circuit 800 starts (or continues) measuring any currents occurring on measuring point 620. Hereto, the measured currents are compared to any predefined maximum value by the cooperator system 830. As soon as the predefined maximum value is achieved by the detected currents, the logic circuit 800 causes the charging switch 220 to open again.

Again, the remaining currents at measuring point 620 are detected and compared to any predefined minimum value. As soon as said predefined minimum value is achieved, the logic circuit 800 causes the branch selector switch 11, 21, 31, 41, 51 or 61 to close again and the procedure starts once again.

The closing and opening of the charging switch 220 is repeated as long as the detected voltage at measuring point 600 or 610 is below the target voltage. As soon as the target voltage is achieved, the logic circuit stops the continuation of the procedure.

The discharging procedure takes place in a corresponding way: Now the selection of the piezoelectric element 10, 20, 30, 40, 50 or 60 is obtained by means of the group selector switches 310 resp. 320, the discharging switch 230 instead of the charging switch 220 is opened and closed and a predefined minimum target voltage is to be achieved.

Figure 5:
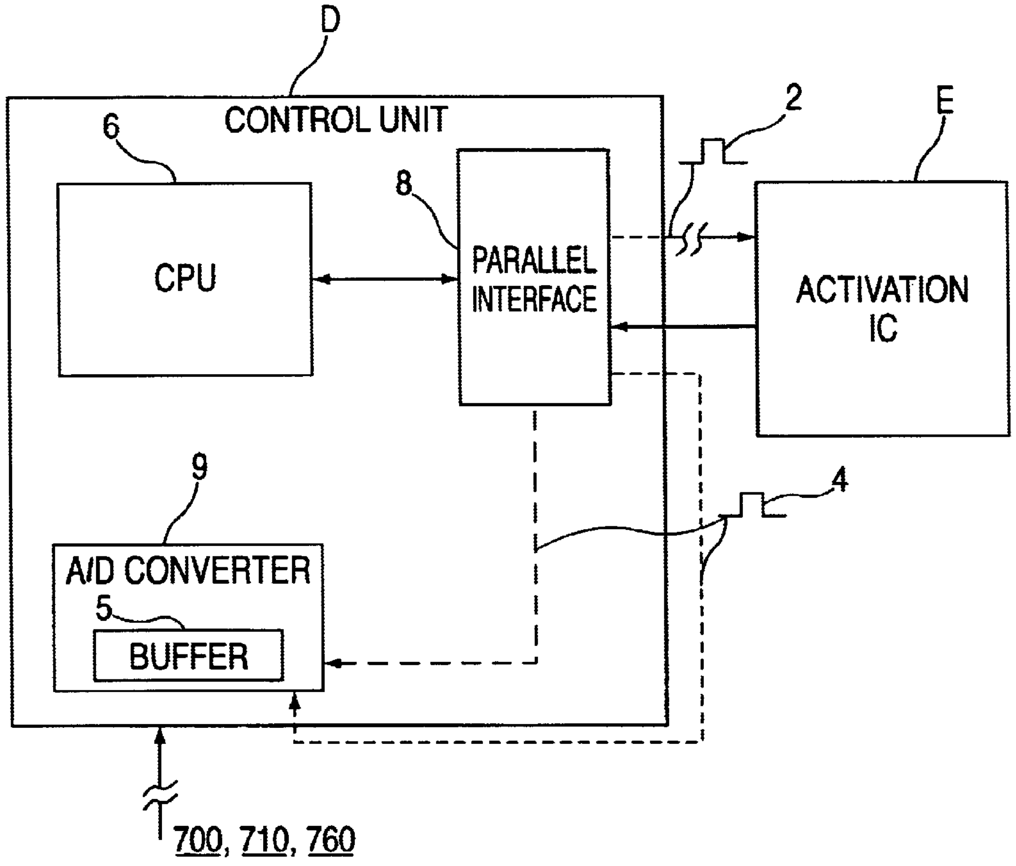
FIG. 5 shows a block diagram of the control unit D of FIG. 2.

Reference may now additionally be had to FIG. 5, which shows a block diagram of the control unit D. Control unit D includes central processing unit (CPU) 6, parallel interface 8 and analog/digital converter 9. Analog/digital converter 9 includes a results buffer 5 for storing measured voltages received via lines 700, 710 and 760 from voltage measuring points 600, 610 and 640, respectively.

Strobe pulses 2 trigger the beginning or end of an injection event. CPU 6 determines which piezoelectric actuator is to be charged or discharged, i.e., which engine cylinder's injection valve is to be affected and, consequently, which piezoelectric actuator is to have its voltage measured. CPU 6 also determines when the voltage across buffer capacitor 210 is to be measured. The identification of the device to be measured is sent from CPU 6 to parallel interface 8. CPU 6 preferably increments the piezoelectric actuator to be measured with every two crankshaft revolutions in synchronization with a four-stroke engine working cycle, though other schemes are possible. CPU 6 may be any suitable processor or microprocessor.

Parallel interface 8, in response to strobe pulses, generates voltage measurement trigger pulses 4, as discussed above with reference to FIG. 1*d*. Trigger pulses 4 may occur at a time offset At before the beginning or after the trailing edge of a strobe pulse 2. Time offset At is selected so as to ensure that the preceding charge or discharge action has been completed. Time offset At may be, for example, 10 to 15 $\mu$sec before the beginning of the next charging/discharging action, or 10 to 15 $\mu$sec before the trailing edge of the next strobe pulse.

Referring to FIGS. 6*a* through *d*, a piezoelectric actuator may undergo a period of damped mechanical oscillation following a charging/discharging action 1 of an injection event VE2, VE1, etc., with an oscillation 3 in the voltage level across the actuator. Voltage level measurements of the actuator taken during this period may be non-useful or at least not fully useful. In one embodiment of the invention, trigger pulses 4 are generated at the same time as the start of the strobe pulse 2 of the following charging/discharging action 1, as shown in FIGS. 6*b* through *d*. The voltage measurement is thereby performed as late as possible after the charging or discharging action which established the voltage level to be measured, but still before the start of the following charging/discharging action. This embodiment may avoid voltage measurements being taken during the oscillation period following a charging/discharging action.

Analog/digital converter 9 receives trigger pulses 4 from parallel interface 8 and in response to each trigger pulse reads the voltage across piezo element banks G1 and G2 and across buffer capacitor 210. The voltage is read by first converting the instantaneous analog voltage values received via sensor lines 700, 710 and 760, corresponding to the voltage across bank G1, bank G2 and buffer capacitor 210, respectively, into digital values. The resulting digital voltage values are then saved in results buffer 5. Because analog/digital converter 9 has no information concerning which bank G1 or G2 is the active injection bank, the voltages for both banks are read simultaneously and the results are stored in results buffer 5. This helps to reduce the load on CPU 6 due to communications traffic with analog/digital converter 9, for example, during an injection operation. CPU 6 may then fetch the stored voltage values after the injection event is completed, when the load on the CPU is lower.

An injection cycle of, for example, one bank G1 actuator with injection operations VE1, VE2, HE, and NE can be interrupted by the injection events VE or NE of an actuator in bank G2. Consequently, a voltage measurement trigger pulse is generated for only one actuator defined by the CPU at a time. This makes possible a particularly simple correlation of the values stored in result buffer 5 to the injection operations of a given actuator.

In some embodiments of the present invention, the voltage of less than the described four injection events and even of only one injection event of a given injection cycle for one actuator is measured. For example, if only the HE event occurs, only the voltage for the HE event may be measured.

Numerous variations, beyond the embodiments discussed herein, are possible in specific implementations of a method and/or apparatus according to the present invention. For example, variations are possible in the specific configuration and operation of activation IC E and control unit D. Of course, other activation and control devices may instead be employed within the scope of the present invention, as would be understood by one of skill in the art. The present invention may be applied in different types of engines using piezoelectric elements. It is also to be understood that the present invention is not limited to fuel injection actuators, but may be applied to piezoelectric elements for virtually any suitable use. The scope of the present invention is intended to be limited only by the attached claims.

What is claimed is:

1. A method for timed measurement of a voltage across a device in a charging circuit of at least one piezoelectric element, characterized in that the voltage across the device is sensed; and the sensed voltage is read at a predefined time in synchronization with an injection event of the at least one piezoelectric element.

2. The method as recited in claim 1, characterized in that the device is the at least one piezoelectric element.

3. The method as recited in claim 1, characterized in that the device is a buffer capacitor.

4. The method as recited in claim 1, characterized in that the predefined time is a predefined time offset before or after a respective charging or discharging action of the injection event.

5. The method as recited in claim 4, characterized in that the respective charging or discharging action is started in response to a respective strobe pulse, the predefined time offset being in relation to the respective strobe pulse.

6. The method as recited in claim 5, characterized in that the predefined time is coincident with the respective strobe pulse, the respective charging or discharging action being started a second predefined time offset following the respective strobe pulse.

7. The method as recited in claim 1, characterized in that the read voltage is used for at least one of:

determining an energy loss or power dissipation factor of at least one piezoelectric actuator;

determining a capacitance of the at least one piezoelectric actuator;

diagnosing a capacitance of the buffer capacitor and/or associated circuitry; and regulating a voltage gradient across the device.

8. The method as recited in claim 1, characterized in that the read voltage is used to correct a charging or discharging of the at least one piezoelectric element, in particular for aging phenomena and/or temperature effects.

9. The method as recited in claim 1, characterized in that the read voltage is used for a diagnosis of at least one of the at least one piezoelectric element and/or at least one injector associated with the at least one piezoelectric element.

10. The method as recited in claim 1, characterized in that the at least one piezoelectric element includes at least two piezoelectric elements disposed electrically parallel in a bank, the sensed voltage being the voltage across the bank.

11. The method as recited in claim 1, characterized in that the at least one piezoelectric element is part of an engine fuel injection system.

12. A method for timed measurement of a voltage across a device in a charging circuit of at least one piezoelectric element, comprising the steps of:

(a) sensing the voltage across the device;

(b) reading the sensed voltage at a predefined time in synchronization with an injection event of the at least one piezoelectric element; and (c) using the read voltage to correct a charging or discharging of the at least one piezoelectric element.

13. The method as claimed in claim 12, wherein the correction in step (c) is for at least one of aging phenomena and temperature effects on the at least one piezoelectric element.

* * * * *